(12) United States Patent  
Comunale et al.

(10) Patent No.: US 9,029,765 B2
(45) Date of Patent: May 12, 2015

(54) ION SOURCES, SYSTEMS AND METHODS

(71) Applicant: Carl Zeiss Microscopy, LLC, Thornwood, NY (US)

(72) Inventors: Richard Comunale, Ipswich, MA (US); Alexander Groholski, Salem, MA (US); John A. Notte, IV, Gloucester, MA (US); Randall G. Percival, Raymond, NH (US); Billy W. Ward, Boyce, LA (US)

(73) Assignee: Carl Zeiss Microscopy, LLC, Thornwood, NY (US)

( * ) Notice: Subject to any disclaimer, the term of this patent is extended or adjusted under 35 U.S.C. 154(b) by 0 days.

(21) Appl. No.: 13/892,772

(22) Filed: May 13, 2013

(65) Prior Publication Data
US 2013/0256532 A1   Oct. 3, 2013

Related U.S. Application Data

(63) Continuation of application No. 12/997,371, filed as application No. PCT/US2008/066933 on Jun. 13, 2008, now Pat. No. 8,461,557.

(51) Int. Cl.
*H01J 37/304* (2006.01)
*H01J 37/20* (2006.01)
*H01J 37/26* (2006.01)
(Continued)

(52) U.S. Cl.
CPC ............... *H01J 37/304* (2013.01); *H01J 37/20* (2013.01); *H01J 37/265* (2013.01); *H01J 37/28* (2013.01); *H01J 37/3056* (2013.01); *H01J 2237/0216* (2013.01); *H01J 2237/0805* (2013.01); *H01J 2237/0807* (2013.01);
(Continued)

(58) Field of Classification Search
USPC ....... 250/309, 310, 423 R, 423 F, 426, 492.2, 250/492.21, 492.24, 492.3, 306, 307; 313/230, 10; 274/159, 161, 162
See application file for complete search history.

(56) References Cited

U.S. PATENT DOCUMENTS 4,774,414 A    9/1988  Umemura et al.
5,168,166 A *  12/1992 Hayakawa et al. ........ 250/492.2
(Continued)

FOREIGN PATENT DOCUMENTS

DE    196 04 272     8/1996
JP    55 126949      10/1980
(Continued)

OTHER PUBLICATIONS

Notification of Reasons for Refusal, Japanese Patent Application No. 2011-513470, English Translation included, 9 pages, Dated Jun. 18, 2013.
(Continued)

*Primary Examiner* — Bernard E Souw
(74) *Attorney, Agent, or Firm* — Fish & Richardson P.C.

(57) ABSTRACT

Ion sources, systems and methods are disclosed. In some embodiments, the ion sources, systems and methods can exhibit relatively little undesired vibration and/or can sufficiently dampen undesired vibration. This can enhance performance (e.g., increase reliability, stability and the like). In certain embodiments, the ion sources, systems and methods can enhance the ability to make tips having desired physical attributes (e.g., the number of atoms on the apex of the tip). This can enhance performance (e.g., increase reliability, stability and the like).

21 Claims, 7 Drawing Sheets

(51) Int. Cl.
*H01J 37/28* (2006.01)
*H01J 37/305* (2006.01)

(52) U.S. Cl.
CPC ... *H01J 2237/2007* (2013.01); *H01J 2237/204* (2013.01); *H01J 2237/2482* (2013.01)

(56) References Cited

U.S. PATENT DOCUMENTS

| | | |
|---|---|---|
| 6,765,217 B1 | 7/2004 | Nishimura et al. |
| 7,557,359 B2 * | 7/2009 | Ward et al. ............... 250/423 F |
| 7,786,451 B2 | 8/2010 | Ward et al. |
| 8,319,181 B2 | 11/2012 | Parker et al. |
| 8,461,557 B2 * | 6/2013 | Comunale et al. ......... 250/492.3 |
| 2007/0158558 A1 | 7/2007 | Ward et al. |
| 2007/0228287 A1 | 10/2007 | Ward et al. |
| 2009/0173888 A1 | 7/2009 | Shichi et al. |
| 2011/0240853 A1 * | 10/2011 | Comunale et al. ............ 250/307 |
| 2011/0284746 A1 | 11/2011 | Shimakura et al. |
| 2012/0193530 A1 | 8/2012 | Parker et al. |
| 2012/0217391 A1 * | 8/2012 | Shichi et al. ................ 250/306 |

FOREIGN PATENT DOCUMENTS

| | | | |
|---|---|---|---|
| JP | S 60-232651 | 11/1985 | |
| JP | S 62-114226 | 5/1987 | |
| JP | 62-139227 | 6/1987 | ............... H01J 1/02 |
| JP | 3-214554 | 9/1991 | |
| JP | H3-214554 | * 9/1991 | ....................... 37/22 |
| JP | H 07-192669 | 7/1995 | |
| JP | 7-272652 | 10/1995 | |
| JP | 8-212952 | 8/1996 | ............ H01J 37/075 |

OTHER PUBLICATIONS

The International Search Report and Written Opinion for corresponding PCT Appl. No. PCT/US2008/066933, dated Jun. 9, 2009.

Itakura et al., "Microprobe of Helium Ions," Journal of Vacuum Science and Technology: Part B, AVS / AIP, Melville, New York, NY, US, vol. 9, No. 5, Sep. 1, 1991, pp. 2596-2601.

European examination report for EP Appln No. 08 771 031.5, dated May 22, 2014.

Bischoff L et al: "Investigation and optimization of the emission pararneters of alloy liquid metal ion sources", Nuclear Instruments & Methods in Physics Research, Section—B:Beam Interactions With Materials and Atoms, Elsevier, Amsterdam, NL, vol. 161-163, Mar. 1, 2000, pp. 1128-1131, XP004192395.

Schwind G et al: "Emission characteristics of Au60Be40 and Au62Si23Be15 liquid metal ion sources", Journal of Vacuum Science and Technology: Part B, AVS / AIP, Melville, New York, NY, US, vol. 25, No. 6, Dec. 11, 2007, pp. 2586-2592, XP012105526.

Hong-Shi Kuo et al: "Noble Metal/w(111) Single-Atom Tips and Their Field Electron and Ion Emission Characteristics", Japanese Journal of Applied Physics Part.2, The Japan Society of Applied Physics, Japan Society of Applied Physics, Tokyo; JP, vol. 45, No. 11, Nov. 8, 2006, pp. 8972-8983, XP007903666.

Jousten K et al: "Growth and current characteristics of stable protrusions on tungsten field ion emitters", Ultramicroscopy, Elsevier, Amsterdam, NL, vol. 26, No. 3, Jan. 1, 1988, pp. 301-311, XP024643774.

Japanese Office Action, with translation thereof, for JP Appl No. 2011-513470, dated Aug. 19, 2014.

* cited by examiner

ION SOURCES, SYSTEMS AND METHODS

CROSS-REFERENCE TO RELATED APPLICATIONS

This application is a continuation of, and claims priority under 35 USC 120 to, U.S. application Ser. No. 12/997,371, filed Jun. 3, 2011, now U.S. Pat. No. 8,461,557, which is the National Stage of International Application No. PCT/US2008/066933, filed Jun. 13, 2008. U.S. application Ser. No. 12/997,371 and international application PCT/US2008/066933 are hereby incorporated by reference in their entirety.

TECHNICAL FIELD

This disclosure relates to ion sources, systems and methods.

BACKGROUND

Ion sources and systems can produce ion beams which are used to investigate and/or modify a sample.

SUMMARY

The disclosure relates to ion sources, systems and methods.

In some embodiments, the ion sources, systems and methods can exhibit relatively little undesired vibration and/or can sufficiently dampen undesired vibration. This can enhance performance (e.g., increase reliability, stability and the like).

In certain embodiments, the ion sources, systems and methods can enhance the ability to make tips having desired physical attributes (e.g., the number of atoms on the apex of the tip). This can enhance performance (e.g., increase reliability, stability and the like).

In one aspect, the disclosure generally features a system that includes a charged particle column, a detector and an optical reflective element having a first position and a second position. When in the first position, the optical reflective element can reflect light passing through the charged particle column to the detector. When in the second position, the optical reflective element cannot reflect light passing through the charged particle column to the detector. In some embodiments, the system further includes a positioning device configured to move the optical reflective element between its first and second positions. In certain embodiments, the charged particle column is an ion column. In some embodiments, the system further includes a charged particle source. The charged particle source can be configured so that during use at least some of the charged particles generated by the charged particle source pass through the charged particle column. The charged particle source can be configured so that, when it emits light, the light goes into the column and can be reflected by the optical reflective element when it is in the first position. In certain embodiments, the detector is configured to detect light reflected by the optical reflective element.

In another aspect, the disclosure generally features a system that includes a charged particle column and an optical reflective element having an optical reflective portion and an aperture. The optical reflective element is in the charged particle column. The optical reflective portion of the optical reflective element can light passing through the charged particle column. Charged particles emitted by a charged particle source can pass through the aperture of the optical reflective element. In some embodiments, the optical reflective element is fixed with respect to the charged particle column. In certain embodiments, the charged particle column is an ion column.

In some embodiments, the system further includes the charged particle source. The charged particle source can be configured so that during use at least some of the charged particles generated by the charged particle source pass through aperture in the optical reflective element. The charged particle source can be configured so that, when it emits light, the light goes into the column and can be reflected by the optical reflective portion of the optical reflective element. The charged particle column has an axis, and the optical reflective element can be positioned along the axis of the charged particle column. In some embodiments, the system further includes a detector configured to detect light reflected by the optical reflective element.

In a further aspect, the disclosure generally features a system that includes a charged particle column having an axis, and an optical reflective element positioned within the charged particle column and displaced off-axis with respect to the axis of the charged particle column. The optical reflective element is coupled to the charged particle column. In some embodiments, the optical reflective element is fixed with respect to the charged particle column. In certain embodiments, the system further includes a support to which the optical reflective element is mounted. The support can be fixed with respect to the charged particle column. In some embodiments, the charged particle column is an ion column. In certain embodiments, the system further includes a charged particle source. The charged particle source can be configured so that during use at least some of the charged particles generated by the charged particle source pass through the charged particle column without interacting with the optical reflective element. The charged particle source can be configured so that, when it emits light, the light goes into the column and can be reflected by the optical reflective element. In some embodiments, the system further includes a detector configured to detect light reflected by the optical reflective element.

In an additional aspect, the disclosure generally features a system that includes a charged particle column and a moveable optical reflective element having a first position in the charged particle column and a second position outside the charged particle column.

In one aspect, the disclosure generally features a charged particle system that includes any of the preceding systems. In some embodiments, the charged particle system can be a gas field ion microscope.

In another aspect, the disclosure generally features a method that includes emitting light from a charged particle source so that the light enters a charged particle column, and reflecting at least a portion of the light in the charged particle column to a detector. In some embodiments, the method also includes using the detected light to determine one or more parameters for preparing a tip of the charged particle source. Examples of parameters include the temperature of the tip of the charged particle source, the gas pressure of a chamber housing the charged particle source, and the intensity of light emitted by the charged particle source. In certain embodiments, the method further includes, based on the detected light, increasing at least one parameter selected from the group consisting of a charged particle source temperature and a gas pressure in a chamber housing the charged particle source. In some embodiments, the charged particle source is an ion source, such as a gas field ion source.

In an further aspect, the disclosure generally features a method that includes using any of the systems described above to make a tip of a charged particle source.

In an additional aspect, the disclosure generally features a system that includes a vacuum housing having a door and a stage assembly. The stage assembly includes a stage configured to support a sample, and a support member connected to the door. The stage is connected to the support via a friction mechanism. In some embodiments, the friction mechanism includes at least one friction bearing. In certain embodiments, the friction mechanism includes a tube that is friction fit within an aperture. In some embodiments, the stage is tiltable relative to the door. In certain embodiments, the friction mechanism can be used to tilt the stage relative to the door. In some embodiments, the system further includes a charged particle source, such as an ion source (e.g., a gas field ion source). In certain embodiments, the system is a gas field ion microscope.

In another aspect, the disclosure generally features a system that includes a sample holder having a first surface and a second surface opposite the first surface. The second surface has a plurality of holes. They system also includes a stage having a surface with support positions. The holes in the second surface of the sample holder are configured to engage with the support positions of the stage. The system further includes at least one magnet configured to secure the sample holder to the stage. In some embodiments, the at least one magnet is a plurality of magnets. In certain embodiments, an exposed surface of the at least one magnet coincides with the second surface of the sample holder. In some embodiments, the system further includes a charged particle source, such as an ion source (e.g., a gas field ion source). In certain embodiments, the system is a gas field ion microscope.

Other features and advantages will be apparent from the description, drawings, and claims.

DESCRIPTION OF DRAWINGS

Like reference symbols in the various drawings indicate like elements.

DETAILED DESCRIPTION

Figure 1:
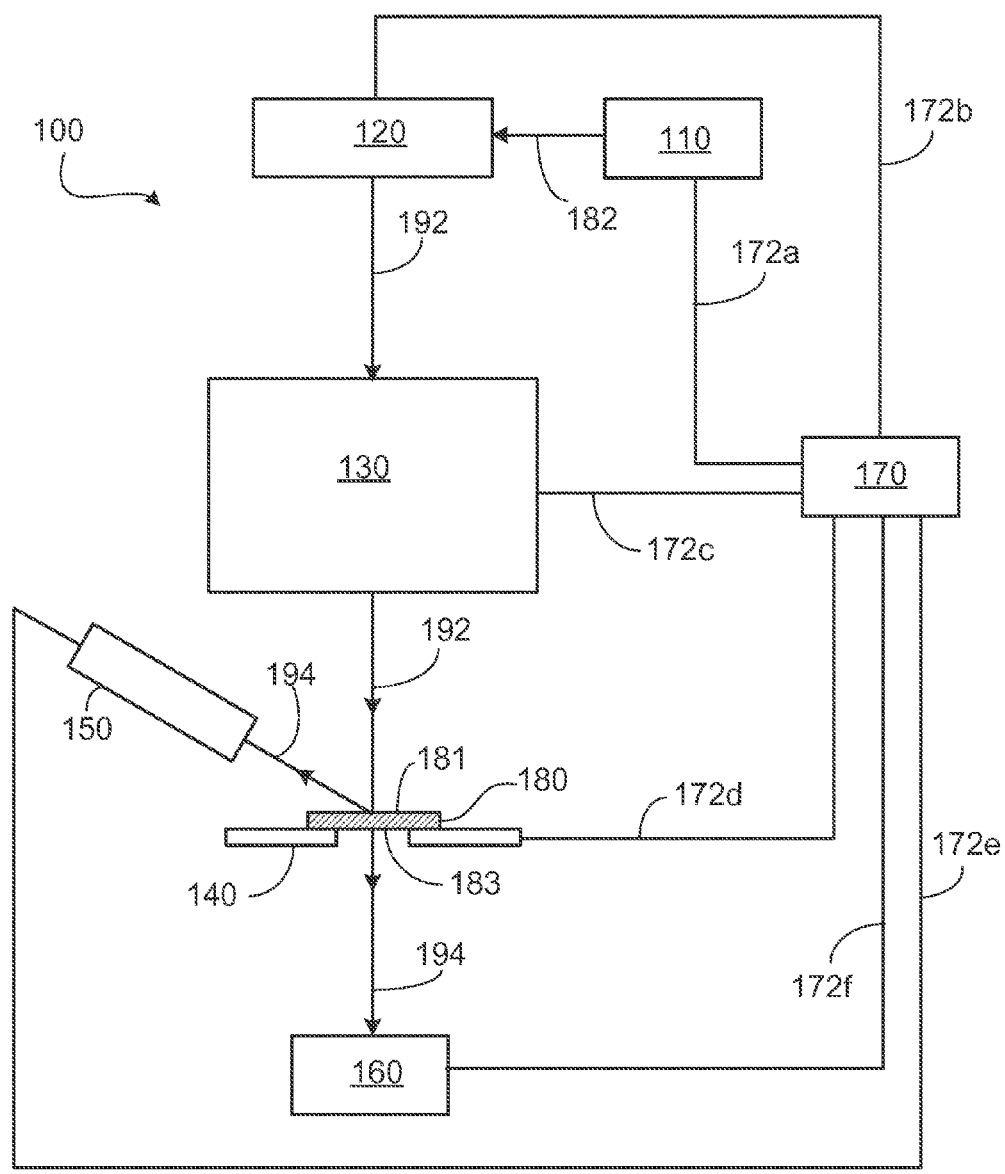
FIG. 1 is a schematic diagram of an ion microscope system.

When used to investigate properties of various samples, ion beams can provide qualitative and/or quantitative measurements that are precise and accurate to atomic resolution. Sample images measured with an ion beam (e.g., images that are derived from measurements of secondary electrons and/or scattered ions and/or scattered neutral atoms) can have very high resolution, revealing sample features that are difficult to observe using other imaging techniques. Optionally, ion beams can be used to provide qualitative and/or quantitative material constituent information about a sample.

An example of a sample is a semiconductor article. Semiconductor fabrication typically involves the preparation of an article (a semiconductor article) that includes multiple layers of materials sequentially deposited and processed to form an integrated electronic circuit, an integrated circuit element, and/or a different microelectronic device. Such articles typically contain various features (e.g., circuit lines formed of electrically conductive material, wells filled with electrically non-conductive material, regions thrilled of electrically semi-conductive material) that are precisely positioned with respect to each other (e.g., generally on the scale of within a few nanometers). The location, size (length, width, depth), composition (chemical composition) and related properties (conductivity, crystalline orientation magnetic properties) of a given feature can have an important impact on the performance of the article. For example, in certain instances, if one or more of these parameters is outside an appropriate range, the article may be rejected because it cannot function as desired. As a result, it is generally desirable to have very good control over each step during semiconductor fabrication, and it would be advantageous to have a tool that could monitor the fabrication of a semiconductor article at various steps in the fabrication process to investigate, the location, size, composition and related properties of one or more features at various stages of the semiconductor fabrication process. As used herein, the term semiconductor article refers to an integrated electronic circuit, an integrated circuit element, a microelectronic device or an article formed during the process of fabricating an integrated electronic circuit, an integrated circuit element, a microelectronic device. In some embodiments, a semiconductor article can be a portion of a flat panel display or a photovoltaic cell. Regions of a semiconductor article can be formed of different types of material (electrically conductive, electrically non-conductive, electrically semiconductive). Exemplary electrically conductive materials include metals, such as aluminum, chromium, nickel, tantalum, titanium, tungsten, and alloys including one or more of these metals (e.g., aluminum-copper alloys). Metal silicides (e.g., nickel silicides, tantalum silicides) can also be electrically conductive. Exemplary electrically non-conductive materials include borides, carbides, nitrides, oxides, phosphides, and sulfides of one or more of the metals (e.g., tantalum borides, tantalum germaniums, tantalum nitrides, tantalum silicon nitrides, and titanium nitrides). Exemplary electrically semiconductive materials include silicon, germanium and gallium arsenide. Optionally, an electrically semiconductive material can be doped (p-doped, n-doped) to enhance the electrical conductivity of the material. Typical steps in the deposition/processing of a given layer of material include imaging the article (e.g., to determine where a desired feature to be formed should be located), depositing an appropriate material (e.g., an electrically conductive material, an electrically semiconductive material, an electrically non-conductive material) and etching to remove unwanted material from certain locations in the article. Often, a photoresist, such as a polymer photoresist, is deposited/exposed to appropriate, radiation/selectively etched to assist in controlling the location and size of a given feature. Typically, the photoresist is removed in one or more subsequent process steps and, in general, the final semiconductor article desirably does not contain an appreciable amount of photoresist.

FIG. 1 shows a schematic diagram of a gas field ion microscope system 100 that includes a gas source 110, a gas field ion source 120, ion optics 130, a sample manipulator 140, a front-side detector 150, a back-side detector 160, and an electronic control system 170 (e.g., an electronic processor, such as a computer) electrically connected to various components of system 100 via communication lines 172*a*-172*f*. A sample 180 is positioned in/on sample manipulator 140 between ion optics 130 and detectors 150, 160. During use, an ion beam 192 is directed through ion optics 130 to a surface 181 of sample 180, and particles 194 resulting from the interaction of ion beam 192 with sample 180 are measured by detectors 150 and/or 160.

Figure 2:
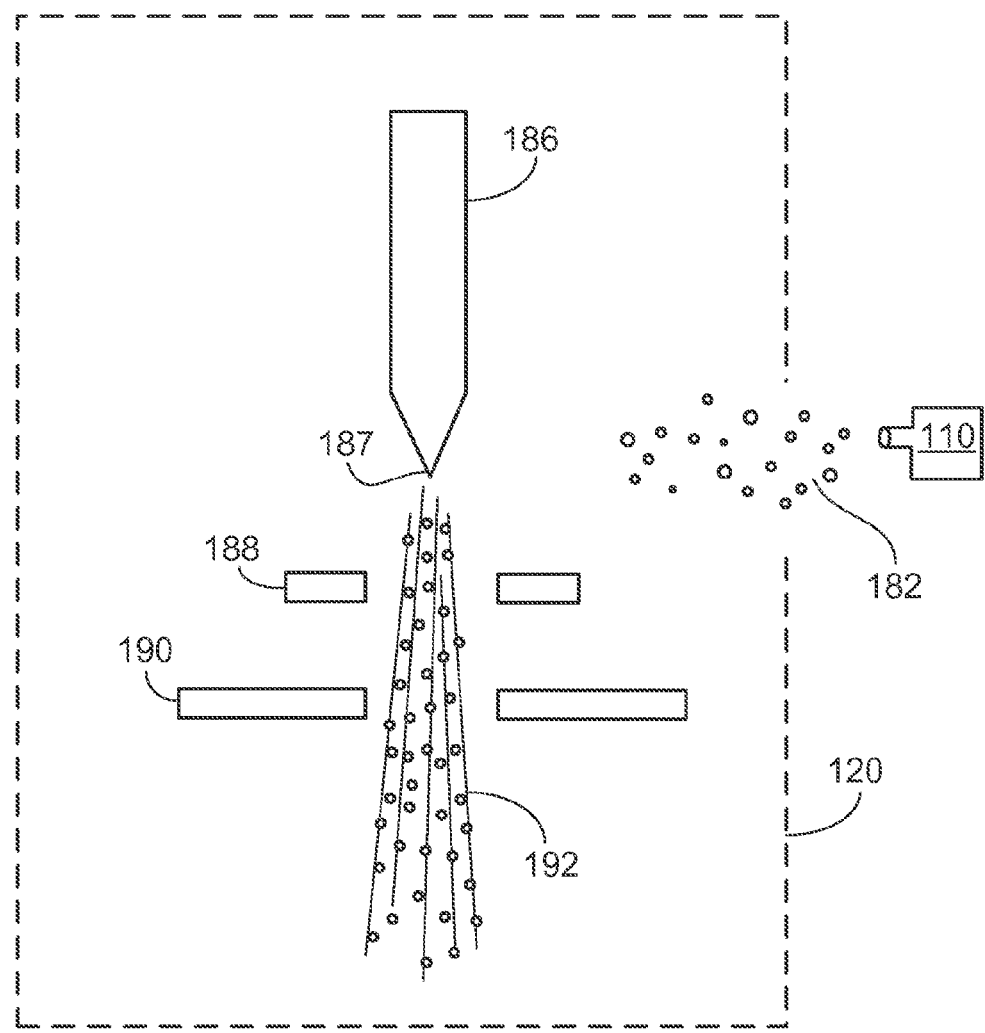
FIG. 2 is a schematic diagram of a gas field ion source.

As shown in FIG. 2, gas source 110 is configured to supply one or more gases 182 to gas field ion source 120. Gas source 110 can be configured to supply the gas(es) at a variety of purities, flow rates, pressures, and temperatures. In general, at least one of the gases supplied by gas source 110 is a noble gas (helium (He), neon (Ne), argon (Ar), krypton (Kr), xenon (Xe)), and ions of the noble gas are desirably the primary constituent in ion beam 192. In general, as measured at surface 181 of sample 180, the current of ions in ion beam 192 increases monotonically as the pressure of the noble gas in system 100 increases. In certain embodiments, this relationship can be described by a power law where, for a certain range of noble gas pressures, the current increases generally in proportion to gas pressure.

Optionally, gas source 110 can supply one or more gases in addition to the noble gas(es), an example of such a gas is nitrogen. Typically, while the additional gas(es) can be present at levels above the level of impurities in the noble gas(es), the additional gas(es) still constitute minority components of the overall gas mixture introduced by gas source 110.

Gas field ion source 120 is configured to receive the one or more gases 182 from gas source 110 and to produce gas ions from gas(es) 182. Gas field ion source 120 includes an electrically conductive tip 186 with a tip apex 187, an extractor 190 and optionally a suppressor 188.

Electrically conductive tip 186 can be formed of various materials. In some embodiments, tip 186 is formed of a metal (e.g., tungsten (W), tantalum (Ta), iridium (Ir), rhenium (Rh), niobium (Nb), platinum (Pt), molybdenum (Mo)). In certain embodiments, electrically conductive tip 186 can be formed of an alloy. In some embodiments, electrically conductive tip 186 can be formed of a different material (e.g., carbon (C)).

During use, tip 186 is biased positively (e.g., approximately 20 kV) with respect to extractor 190, extractor 190 is negatively or positively biased (e.g., from −20 kV to +50 kV) with respect to an external ground, and optional suppressor 188 is biased positively or negatively (e.g., from −5 kV to +5 kV) with respect to tip 186. Because tip 186 is formed of an electrically conductive material, the electric field of tip 186 at tip apex 187 points outward from the surface of tip apex 187. Due to the shape of tip 186, the electric field is strongest in the vicinity of tip apex 187. The strength of the electric field of tip 186 can be adjusted, for example, by changing the positive voltage applied to tip 186. With this configuration, un-ionized gas atoms 182 supplied by gas source 110 are ionized and become positively-charged ions in the vicinity of tip apex 187. The positively-charged ions are simultaneously repelled by positively charged tip 186 and attracted by negatively charged extractor 190 such that the positively-charged ions are directed from tip 186 into ion optics 130 as ion beam 192. Suppressor 188 assists in controlling the overall electric field between tip 186 and extractor 190 and, therefore, the trajectories of the positively-charged ions from tip 186 to ion optics 130. In general, the overall electric field between tip 186 and extractor 190 can be adjusted to control the rate at which positively-charged ions are produced at tip apex 187, and the efficiency with which the positively-charged ions are transported from tip 186 to ion optics 130.

In general, ion optics 130 are configured to direct ion beam 192 onto surface 181 of sample 180. Ion optics 130 can, for example, focus, collimate, deflect, accelerate, and/or decelerate ions in beam 192. Ion optics 130 can also allow only a portion of the ions in ion beam 192 to pass through ion optics 130. Generally, ion optics 130 include a variety of electrostatic and other ion optical elements that are configured as desired. By manipulating the electric field strengths of one or more components (e.g., electrostatic deflectors) in ion optics 130, He ion beam 192 can be scanned across surface 181 of sample 180. For example, ion optics 130 can include two deflectors that deflect ion beam 192 in two orthogonal directions. The deflectors can have varying electric field strengths such that ion beam 192 is rastered across a region of surface 181.

When ion beam 192 impinges on sample 180, a variety of different types of particle 194 can be produced. These particles include, for example, secondary electrons, Auger electrons, secondary ions, secondary neutral particles, primary neutral particles, scattered ions and photons (e.g., X-ray photons, IR photons, visible photons, UV photons). Detectors 150 and 160 are positioned and configured to each measure one or more different types of parades resulting from the interaction between He ion beam 192 and sample 180. As shown in FIG. 1 detector 150 is positioned to detect particles 194 that originate primarily from surface 181 of sample 180, and detector 160 is positioned to detect particles 194 that emerge primarily from surface 183 of sample 180 (e.g., transmitted particles). As described in more detail below, in general, any number and configuration of detectors can be used in the microscope systems disclosed herein. In some embodiments, multiple detectors are used, and some of the multiple detectors are configured to measure different types of particles. In certain embodiments, the detectors are configured to provide different information about the same type of particle (e.g., energy of a particle, angular distribution of a given particle, total abundance of a given particle). Optionally, combinations of such detector arrangements can be used.

In general, the information measured by the detectors is used to determine information about sample 180. Typically, this information is determined by obtaining one or more images of sample 180. By rastering ion beam 192 across surface 181, pixel-by-pixel information about sample 180 can be obtained in discrete steps. Detectors 150 and/or 160 can be configured to detect one or more different types of particles 194 at each pixel.

The operation of microscope system 100 is typically controlled via electronic control system 170. For example, electronic control system 170 can be configured to control the gas(es) supplied by gas source 110, the temperature of tip 186, the electrical potential of tip 186, the electrical potential of extractor 190, the electrical potential of suppressor 188, the settings of the components of ion optics 130, the position of sample manipulator 140, and/or the location and settings of detectors 150 and 160. Optionally, one or more of these parameters may be manually controlled (e.g., via a user interface integral with electronic control system 170). Additionally or alternatively, electronic control system 170 can be used (e.g., via an electronic processor, such as a computer) to analyze the information collected by detectors 150 and 160 and to provide information about sample 180 (e.g., topography information, material constituent information, crystalline information, voltage contrast information, optical property information, magnetic information), which can optionally be in the form of an image, a graph, a table, a spreadsheet, or the like. Typically, electronic control system 170 includes a user interface that features a display or other kind of output device, an input device, and a storage medium.

In certain embodiments, electronic control system 170 can be configured to control various properties of ion beam 192. For example, control system 170 can control a composition of ion beam 192 by regulating the flow of gases into gas field ion source 120. By adjusting various potentials in ion source 120 and ion optics 130, control system 170 can control other properties of ion beam 192 such as the position of the ion beam on sample 180, and the average energy of the incident ions.

In some embodiments, electronic control system 170 can be configured to control one or more additional particle beams. For example, in certain embodiments, one or more types of ion beam source and/or electron beam sources can be present. Control system 170 can control each of the particle beam sources and their associated optical and electronic components.

Detectors 150 and 160 are depicted schematically in FIG. 1, with detector 150 positioned to detect particles from surface 181 of sample 180 (the surface on which the ion beam impinges), and detector 160 positioned to detect particles from surface 183 of sample 180. In general, a wide variety of different detectors can be employed in microscope system 200 to detect different particles, and a microscope system 200 can typically include any desired number of detectors. The configuration of the various detector(s) can be selected in accordance with particles to be measured and the measurement conditions. In some embodiments, a spectrally resolved detector may be used. Such detectors are capable of detecting particles of different energy and/or wavelength, and resolving the particles based on the energy and/or wavelength of each detected particle.

Detection systems and methods are generally disclosed, for example, in US 2007-0158558, the entire contents of which are incorporated herein by reference.

In general, the accuracy of ion beam measurements depends, in part, on the stability of the ion beam during measurement. For example, fluctuations in the position of the ion beam on the surface of a sample during a measurement can lead to errors in spatially resolved measurements.

One source of such fluctuations in the position of the ion beam can be mechanical vibrations which lead to displacement of the sample relative to the ion beam during the course of a measurement. Ion beam sources typically use a variety of components such as pumps and drive mechanisms that produce low frequency vibrations when activated. Such low frequency vibrations can couple through intermediate components, inducing motion of the sample relative to the ion beam. As an example, such low frequency vibrations can couple through components formed of relatively rigid materials (e.g., stainless steel) and into the sample holder.

Figure 3:
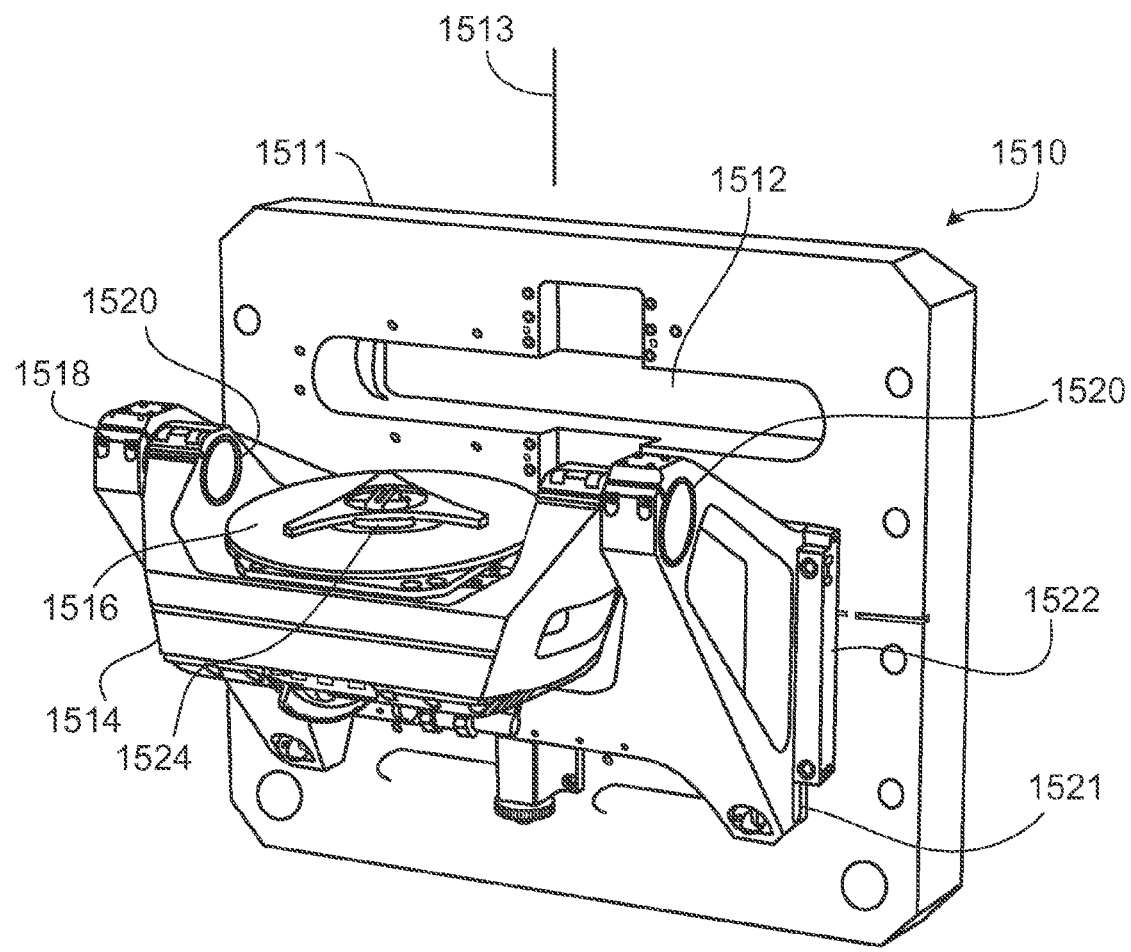
FIG. 3 is a schematic diagram of a sample holder assembly.

A sample holder assembly 1510 that provides for improved stability and reduced vibrational coupling to a sample is shown in FIG. 3. Assembly 1510 is mounted to a body 1511 having an opening 1512 to insert a sample. In some embodiments, body 1511 does not include an opening, and is instead a solid member that corresponds to a door of a sample chamber. To insert a sample, body 1511 swings open on a side-mounted hinge, exposing the sample holder assembly for sample mounting.

Body 1511 is connected to arms 1518 of the sample holder assembly through adjustable connectors 1522. Arms 1518 support a sample stage 1514 via friction bearing 1520. Sample stage 1514 includes a mounting surface 1516 having an aperture 1524.

Sample holder assembly 1510 can be connected to an ion microscope such that a tip from which the ion beam is generated is pointed towards aperture 1524 on sample stage 1514. Body 1511 can be formed from suitable rigid materials such as hardened steel, stainless steel, phosphor bronze, and titanium. Typically, for example, body 1511 corresponds to a door of a sample chamber and is square or rectangular in shape, with a thickness of between 0.25 inches and 2 inches or more. By forming body 1511 from a relatively thick piece of metal, body 1511 is relatively highly resistant to deformation, and therefore does not transmit mechanical vibrations efficiently.

Sample stage 1514 is supported by arms 1518 connected to body 1511 along adjustable connectors 1522. Adjustable connectors 1522 comprise rails with recesses that mate cooperatively with flanges 1521 of arms 1518. Arms 1518 are movable in the vertical direction of FIG. 3 with respect to body 1511 by sliding flanges 1521 within the recesses of adjustable connectors 1522. In FIG. 3, the vertical direction is parallel to the optical axis 1513 of the ion beam system. In other words, arms 1518 are movable in a direction that is parallel to optical axis 1513 of the ion beam system.

Following movement in the vertical direction, arms 1518 (and stage 1514 connected thereto) can be locked in a specific position. Stage assembly 1510 includes pneumatic or vacuum clamps (not shown in FIG. 3) positioned on the opposite side of body 1511 from arms 1518, and connected to arms 1518 through apertures in body 1511. To lock arms 1518 in position relative to body 1511, the pneumatic or vacuum clamps are engaged, pulling arms 1518 tight against body 1511 and preventing further relative motion between body 1511 and arms 1518.

During operation of assembly 1510, body 1511, which corresponds to a door of the sample chamber, swings open to expose stage 1514. A sample is mounted on stage 1514, and then body 1511 swings closed to seal the sample chamber. A suitable height for the mounted sample is selected by releasing the pneumatic (or vacuum) clamps that fix the position of arms 1518 relative to body 1511, and then translating arms 1518 along the vertical direction in FIG. 3. Flanges 1521 of arms 1518 move relative to connectors 1522 during the vertical translation of arms 1518. When the sample has been positioned at a desired vertical position, the pneumatic (or vacuum) clamps are re-engaged, rigidly locking arms 1518 in place against body 1511 and preventing further relative motion between arms 1518 and body 1511 in the vertical direction. The rigid locking of arms 1518 to body 1511 has the added benefit of increasing the resistance of body 1511 to flexural deformation when vibrations (e.g., from pumps and other sources) are coupled to body 1511.

Sample stage 1514 is connected to arms 1518 via friction bearings 1520. Friction bearings 1520 include a hollow cylindrical shaft that extends from arm 1518 and into a mating aperture on stage 1514. Stage 1514 includes two such friction bearings, as shown in FIG. 3. The cylindrical shaft is sized to provide an interference fit with the mating aperture on stage 1514. As a result, the two friction bearings 1520 allow stage 1514 to tilt relative to arms 1518, out using moving parts such as oil coated ball bearings that can introduce contaminants into the sample chamber. As shown in FIG. 3, the tilt axis (e.g., the axis about which stage 1514 is rotatable) is perpendicular to the optical axis of the ion beam system (e.g., optical axis 1513).

In certain embodiments, friction bearings 1520 include a hollow cylindrical shaft that extends from stage 1514 and into a mating aperture on arm 1518. Two such friction bearings 1520 can be provided, one on each side of stage 1514 as shown in FIG. 3. The cylindrical shaft is sized to provide an interference fit with the mating aperture on arm 1518. As a result, the friction bearings 1520 allow stage 1514 to tilt relative to arms 1518. The tilt axis (e.g., the axis about which stage 1514 is rotatable), as shown in FIG. 3, is perpendicular to the optical axis of the ion beam system (e.g., optical axis 1513).

The interference fit in each friction bearing 1520 is sufficiently restrictive so that stage 1514 can be tilted to an angle of 45 degrees or more without undergoing slip relative to arms 1518. Generally, a motor is used to adjust the tilt angle of stage 1514. Due to the friction bearings, tilt motion of the stage is typically not continuous, but occurs in a series of tiny jumps, each corresponding to an angular displacement of less than about 0.25 degrees (e.g., less than 0.20 degrees, less than 0.15 degrees, less than 0.10 degrees, less than 0.05 degrees). In other words, the diameter of the cylindrical shaft and of the mating hole in friction bearing 1520 are selected so that the tiny jumps in angular displacement of stage 1514 relative to arms 1518 during relative motion are about 0.25 degrees or less.

Sample stage 1514 further includes mounting surface 1516 which can have an opening 1524. A sample can be placed on mounting surface 1516 and a sample position control system can be used to move the sample in the plane of surface 1516. In certain embodiments, surface 1516 (or a portion thereof) can be rotated about its center to rotate the sample. As shown in FIG. 3, in some embodiments, the tilt angle of stage 1514 is zero. Accordingly, a rotation axis of surface 1516 (e.g., the axis about which surface 1516 is rotated) is oriented in the vertical direction of FIG. 3, parallel to the direction of optical axis 1513 of the ion beam system. Surface 1516 can be formed from various types of rigid materials, such as stainless steel, ceramic, glass and polymers.

Movement of surface 1516 in the horizontal place (e.g., perpendicular to the vertical direction in FIG. 3) is typically controlled by piezoelectric devices. The relatively high stiffness of piezoelectric devices ensures that surface 1516 remains rigidly fixed in position in the horizontal plane of FIG. 3 (e.g., the plane perpendicular to optical axis 1513), and external vibrations do not effectively couple into surface 1516 along the horizontal plane of FIG. 3.

Figure 4:
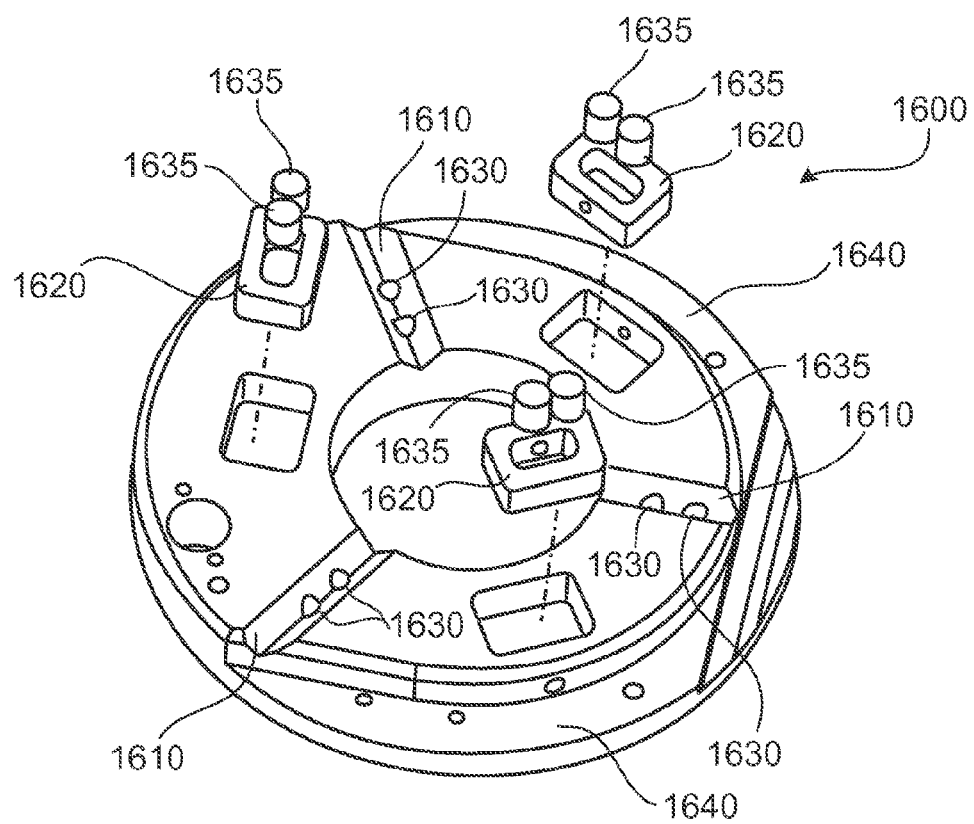
FIG. 4 is a schematic diagram of a magnetic sample holder.

A particular advantage of the stage assembly 1510, as discussed above, is the absence of ball bearings in the assembly, which are typically coated with a hydrocarbon-based lubricants. Such lubricants act as impurities within a sample chamber, depositing on chamber surfaces and even on the surface of the sample during exposure to the ion beam. By eliminating the use of such bearings, a potential source of contaminants is also eliminated from the ion beam system. To ensure secure but removable mounting, samples are mounted to stage 1514 using magnetic sample holder. An embodiment of a magnetic sample holder 1600 is shown in FIG. 4. FIG. 4 depicts the underside of sample holder 1600 which mates with mounting surface 1516 of assembly 1510. Sample holder 1600 includes three support structures 1610 and three magnetic contacts 1620.

Each of the three support structures 1610 includes two holes 1630 that are sized to accommodate two corresponding conical pins that extend upwards from surface 1516. By positioning sample holder 1600 with each of the six pins that extend upwards from surface 1516, sample holder 1600 can be reproducibly positioned relative to surface 1516 with a tolerance of a one micron or less.

To rigidly affix sample holder 1600 to surface 1516, each of the three magnetic contacts 1620 is positioned adjacent to a corresponding piece of magnetic steel which is mounted in surface 1516. The correct positioning of the magnetic contacts 1620 is achieved automatically by engaging holes 1630 with the conical pins of surface 1516. Strong magnetic field interactions between contacts 1620 and the corresponding steel magnets in surface 1516 ensure that sample holder 1600 is affixed to surface 1515 with significant force.

Each of the magnetic contacts includes two strong permanent magnets 1635 encased in a 5-sided enclosure of mu-metal. Only the lower surface of the mu-metal enclosure is left open (e.g., the surface adjacent to the steel magnets in surface 1516. The other surfaces of the mu-metal enclosure are closed to restrict the spatial extent of the magnetic field extending from magnets 1635.

The two permanent magnets 1635 in each contact 1620 are oriented to that their poles are opposed. As a result, magnetic field lines extending from the two magnets are relatively restricted spatially. Because of this, and because of the mu-metal enclosure, the magnetic fields generated by contacts 1620 do not perturb the ion beam during sample exposure.

To introduce a sample onto mounting surface 1516, the sample is first mounted to the underside of sample holder 1600 in FIG. 4. Then, sample holder 1600 is placed on a mounting arm, which engages with recessed lip 1640 of holder 1600. The mounting arm (not shown in FIG. 4) is extended toward surface 1516, and rotated to ensure alignment of the conical pins with holes 1630. As the mounting arm is lowered toward surface 1516, the magnetic force between contacts 1620 and the corresponding magnets in surface 1516 fix holder 1600 in place atop surface 1516, supported by the six conical pins extending from surface 1516. In this fixed position, contacts 1620 are positioned within 500 microns of the magnets in surface 1516. The mounting arm is then carefully withdrawn, and sample holder 1600 (and the sample mounted thereon) remain fixed to surface 1516.

In some embodiments, the magnets positioned in surface 1516 are permanent magnets. In certain embodiments, the magnets positioned in surface 1516 can be switched on and off (e.g., by changing the position of the magnets in surface 1516 via rotation, and/or by applying a counteracting electromagnetic field via one or more magnetic coils that balances the magnetic field of the magnets in surface 1516). Switchable magnets can be particularly advantageous when positioning sample holder 1600 relative to surface 1516. For example, with the magnets switched off, sample holder 1000 can be positioned atop the supporting conical pins that extend from surface 1516. When sample holder 1600 is in the correct position, the magnets can be switched on to lock sample holder 1600 in place relative to surface 1516. Typically, the magnetic force between contacts 1620 and the magnets in surface 1560 is sufficiently strong to prevent relative movement of sample holder 1600 at tilt angles of 45 degrees or more.

As noted above, tips for ion beam sources can be produced by first forming a tip from a material such as, for example, tungsten. In some embodiments, forming the tip involves sharpening a rod (e.g., a tungsten rod) to form a sharpened tip, and field evaporating the sharpened tip to produce a desired terminal shelf of the apex of the tip. In some embodiments, it is desirable for the terminal shelf of the apex of the tip that includes only a small number of atoms (e.g., from 1 to 20 atoms). During field evaporation, the tip is usually heated, and light emanating from the tip can be observed optically (e.g., using the eye, using a light detector). In some instances, the temperature of the tip can be estimated based on the observed tip color. During field evaporation of the tip, the geometry of the tip apex can be monitored by observing the field emission pattern from the tip under an appropriate applied potential (by using heat and electrical potential during field evaporation).

Figure 5:
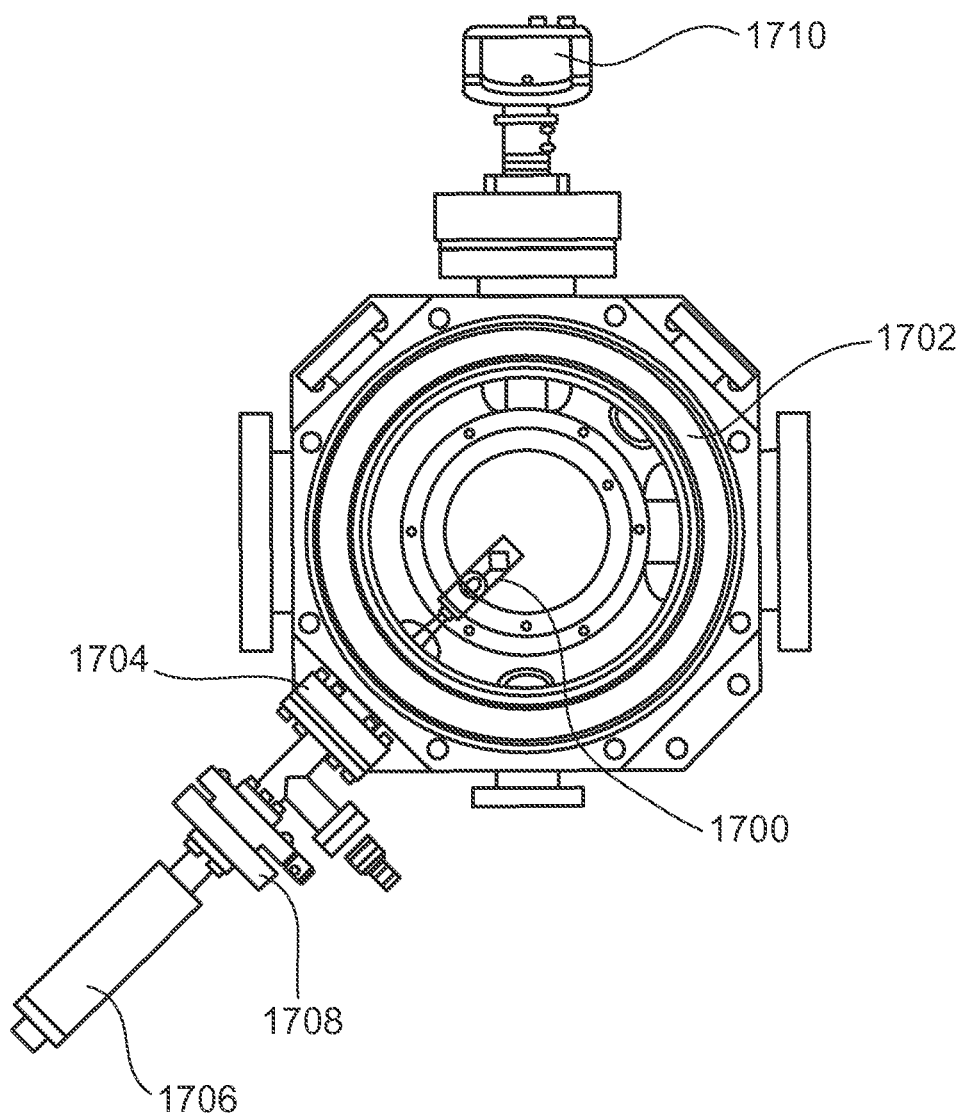
FIG. 5 is a schematic diagram of a sample chamber that includes a retractable positioner.

Observing the tip during fabrication can be difficult because the sharpening and field evaporation steps are typically performed under vacuum in a sample chamber. In addition, the tip is typically oriented such that at least some of the light goes through the ion optics (ion column) which can make it difficult to observe the light. To facilitate observation of the ion source (e.g., during field evaporation when making the tip), the sample chamber can include one or more source viewing optics fixed on a retractable positioner. FIG. 5 shows a retractable positioner 1700 configured for use with a sample chamber in an ion beam system. As shown in FIG. 5, retractable positioner is mounted within a flange 1704 of a sample chamber 1702. Positioner 1700 includes a first actuator 1706 for moving positioner 1700 in an axial direction, and a second actuator 1708 for moving positioner 1700 within a plane perpendicular to the axial direction of the positioner. Also mounted to a flange of chamber 1702 is a measurement device 1710 (e.g., a camera, or a bolometer, or a linear sensor, or another device).

Figure 6:
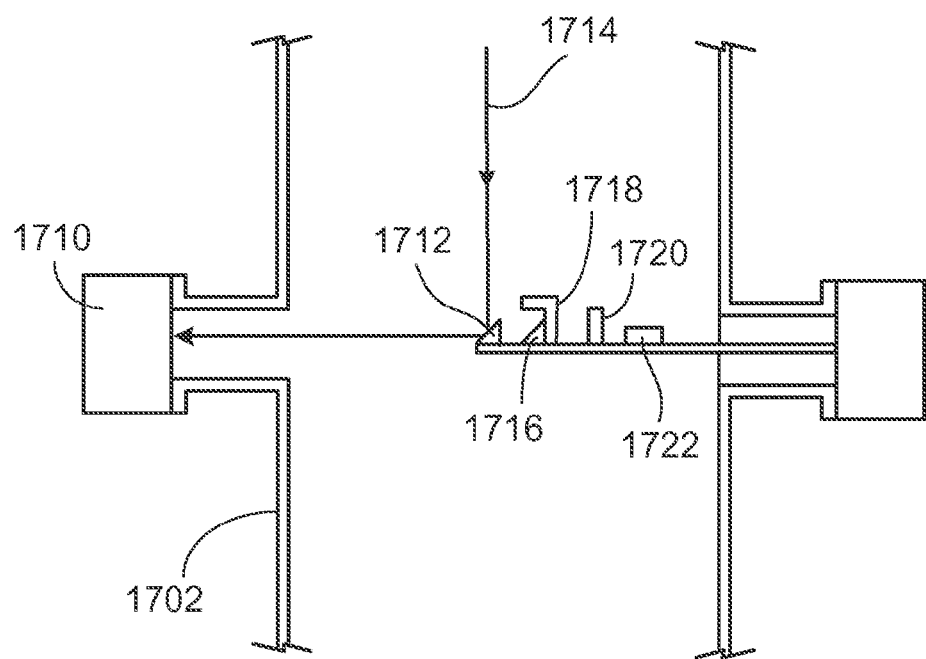
FIG. 6 is a schematic diagram of a positioner.

Positioner 1700 can include a variety of optical elements. In some embodiments, positioner 1700 includes a mirror inclined at an angle to the central axis of chamber 1702 (e.g., perpendicular to the plane of FIG. 5). The inclined mirror 1712 is configured to direct light 1714 emitted by the glowing tip to measurement device 1710, as shown in FIG. 6. Light captured by measurement device 1710 can be used to monitor the tip during fabrication. For example, in certain embodiments, measurement device 1710 can be a camera, and photons produced by the glowing tip during sharpening can be detected by the camera to form an image of the glowing tip. By monitoring the color of the tip, for example, the temperature of the tip can be estimated.

In some embodiments, positioner 1700 can include an angled mirror 1716 as discussed above, and a scintillator material 1718. The scintillator material can be positioned to convert ions produced during field evaporation of the tip to photons. The photons are then directed by angled mirror 1716 to be incident on a camera or other measurement device (e.g., measurement device 1710).

In certain embodiments, positioner 1700 can include a device to measure ion current such as a Faraday cup 1720. The Faraday cup 1720 can be moved into the beam path to capture ions from the tip during field evaporation of the tip. The ion current due to the captured ions can then be measured, and the information used to assess the progress of tip building.

In some embodiments, positioner 1700 can include one or more apertures 1722. Aperture 1722 provides spatial filtering for the ion beam generated from the tip, and can be used to produce an ion beam with particular properties. When multiple apertures are present on positioner 1700, the desired ion beam properties can be selected by selecting a particular aperture.

Figure 7:
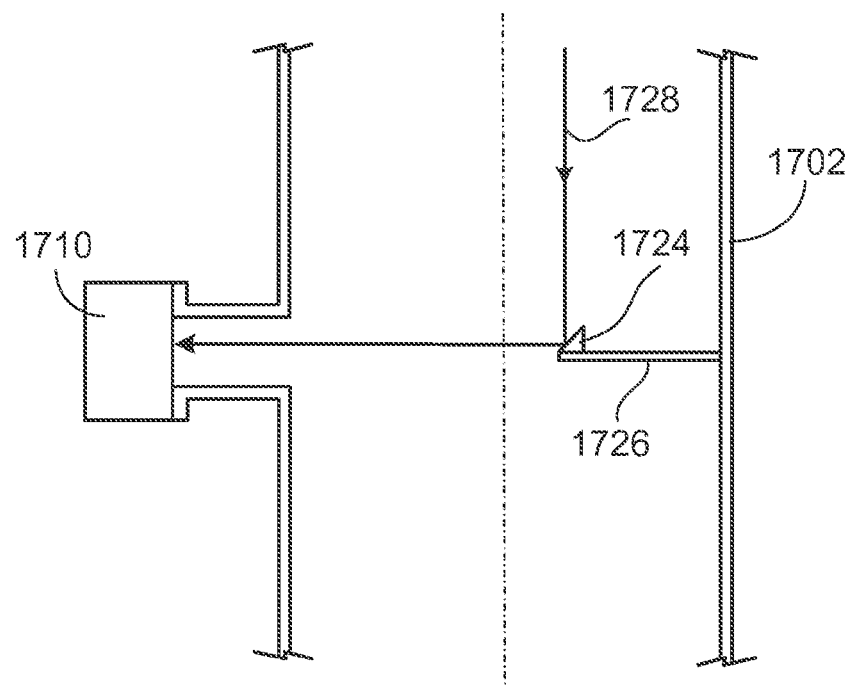
FIG. 7 is a schematic diagram of a chamber that includes an off-axis mirror.

In certain embodiments, chamber 1702 does not include a positioner 1700. Instead, chamber 1702 includes an angled mirror 1724 mounted in an off-axis position within chamber 1702 to a fixed mount 1726, as shown in FIG. 7. Mirror 1724 is positioned to direct oblique light rays 1728 emerging from the tip to measurement device 1710 for observation. The position of angled mirror 1724 is selected so that the mirror does not interfere with the ion beam when the ion beam system is in use.

Figure 8:
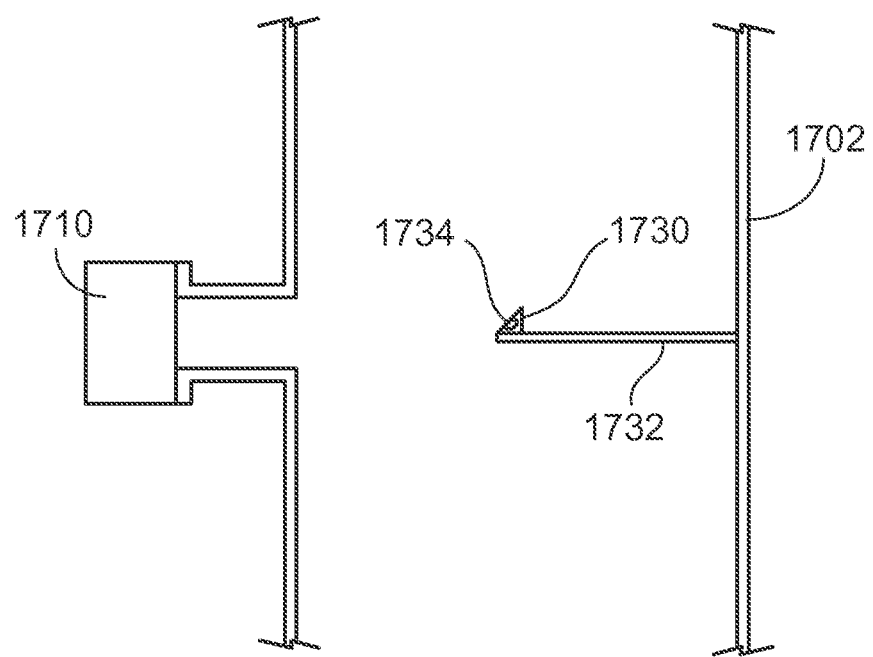
FIG. 8 is a schematic diagram of a chamber that includes an on-axis mirror with an aperture.

In some embodiments, chamber 1702 includes an angled mirror 1730 mounted (via a fixed mount 1732) in the path of the ion beam, as shown in FIG. 8. Angled mirror 1730 includes a central aperture 1734 that permits the ion beam to pass through the mirror. However, the portions of the mirror surface surrounding aperture 1734 are positioned to direct optical radiation from the glowing tip to measurement device 1710 for observation.

Embodiments of positioner 1700 (and also fixed mounts 1726 and/or 1732) can also include a variety of other elements to perform various beam filtering and tip observation functions. For example, positioner 1700 (and mounts 1726 and/or 1732) can include optical filters, adjustable apertures, phosphor-based devices, materials for frequency conversion of optical radiation, various types of electronic measurement devices (e.g., cameras, line sensors, photodiodes, bolometers), and, in general, any type of device that can be mounted on positioner 1700 (and/or mounts 1726 and 1732) and which is suitable for use in the environment of chamber 1702.

Other Embodiments

As an example, while examples have been described in which a gas field ion source is used, other types of ion sources may also be used. In some embodiments, a liquid metal ion source can be used. An example of a liquid metal ion source is a Ga ion source (e.g., a Ga focused ion beam column).

As another example, while embodiments have been described in which an ion source is used, more generally any charged particle source can be used. In some embodiments, an electron source, such as an electron microscope (e.g., a scanning electron microscope) can be used.

As a further example, while embodiments have been described in which samples are in the form of semiconductor articles, in some embodiments, other types of samples can be used. Examples include biological samples (e.g., tissue, nucleic acids, proteins, carbohydrates, lipids and cell membranes), pharmaceutical samples (e.g., a small molecule drug), frozen water (e.g., ice), read/write heads used in magnetic storage devices, and metal and alloy samples. Exemplary samples are disclosed in, for example, US 2007-0158558.

As an additional example, while embodiments have been disclosed in which a sample is inspected, alternatively or additionally, the systems and methods can be used to modify (e.g., repair) a sample (e.g., to repair a region of the article at or near the portion of the article exposed by the cross-section). Such modification can involve gas assisted chemistry, which can be used to add material to and/or remove material to a sample (e.g., a given layer of the sample). As an example, gas assisted chemistry can be used for semiconductor circuit editing in which damaged or incorrectly fabricated circuits formed in semiconductor articles are repaired. Typically, circuit editing involves adding material to a circuit (e.g., to close a circuit that is open) and/or removing material from a circuit (e.g., to open a circuit that is closed). Gas assisted chemistry can also be used in photolithographic mask repair. Mask defects generally include an excess of mask material in a region of the mask where there should be no material, and/or an absence of mask material where material should be present. Thus, gas assisted chemistry can be used in mask repair to add and/or remove material from a mask as desired. Typically, gas assisted chemistry involves the use of a charged particle beam (e.g., ion beam, electron beam, both) that interacts with an appropriate gas (e.g., $Cl_2$, $O_2$, $I_2$, $XeF_2$, $F_2$, $CF_4$, $H_2O$, $XeF_2$, $F_2$, $CF_4$, $WF_6$). As another example, modification of a sample can involve sputtering. In some instances, when fabricating articles, it can be desirable during certain steps to remove materials (e.g., when removing undesired material from a circuit to edit the circuit, when repairing a mask). An ion beam can be used for this purpose where the ion beam sputters material from the sample. In particular, an ion beam generated via the interaction of gas atoms with a gas field ion source as described herein can be used for sputtering a sample. Although He gas ions may be used, it is typically preferable to use heavier ions (e.g., Ne gas ions, Ar gas ions, Kr gas ions, Xe gas ions) to remove material. During the removal of material, the ion beam is focused on the region of the sample where the material to be removed is located. Examples of such inspection are disclosed, for example, in US 2007-0158558.

Combinations of features can be used in various embodiments.

Other embodiments are covered by the claims.

What is claimed is:

1. A method, comprising:
   forming a tip of an ion source;
   providing an ion column;
   passing ions generated by the ion source through the ion column;
   emitting light from the tip of the ion source while forming the tip of the ion source;
   using a detector to detect at least a portion of the light emitted from the tip of the ion source while the ion source is being formed;
   obtaining an image of the tip of the ion source based on the detected light emitted from the tip of the ion source while the ion source was being formed; and
   using the detected light to determine one or more parameters for preparing the tip of the ion source.

2. The method of claim 1, further comprising biasing the tip positively with respect to an extractor.

3. The method of claim 2, further comprising monitoring a geometry of an apex of the tip by observing a field emission pattern of the tip apex.

4. The method of claim 3, wherein the one or more parameters comprise at least one parameter selected from the group consisting of a temperature of the tip, a gas pressure of a chamber housing the ion source, and an intensity of the light emitted by the tip.

5. The method of claim 2, wherein the one or more parameters comprise at least one parameter selected from the group consisting of a temperature of the tip, a gas pressure of a chamber housing the ion source, and an intensity of the light emitted by the tip.

6. The method of claim 1, wherein the one or more parameters comprise at least one parameter selected from the group consisting of a temperature of the tip, a gas pressure of a chamber housing the ion source, and an intensity of the light emitted by the tip.

7. The method of claim 6, further comprising, based on the detected light, increasing at least one parameter selected from the group consisting of the temperature of the tip and the gas pressure in the chamber housing the ion source.

8. The method of claim 5, further comprising, based on the detected light, increasing at least one parameter selected from the group consisting of the temperature of the tip and the gas pressure in the chamber housing the ion source.

9. The method of claim 4, further comprising, based on the detected light, increasing at least one parameter selected from the group consisting of the temperature of the tip and the gas pressure in the chamber housing the ion source.

10. The method of claim 3, further comprising, based on the detected light, increasing at least one parameter selected from the group consisting of a temperature of the tip and a gas pressure in a chamber housing the ion source.

11. The method of claim 2, further comprising, based on the detected light, increasing at least one parameter selected from the group consisting of a temperature of the tip and a gas pressure in a chamber housing the ion source.

12. The method of claim 1, further comprising, based on the detected light, increasing at least one parameter selected from the group consisting of a temperature of the tip and a gas pressure in a chamber housing the ion source.

13. A method, comprising:
    providing an ion source comprising a tip;
    providing an ion column;
    passing ions generated by the ion source through the ion column;
    emitting light from the tip of the ion source;
    detecting at least a portion of the light with a detector;
    obtaining an image of the tip of the ion source based on the detected light that was emitted by the tip of the ion source; and
    using the detected light to determine a temperature of the tip based on the detected light.

14. The method of claim 13, further comprising biasing the tip positively with respect to an extractor.

15. The method of claim 13, further comprising monitoring a geometry of a tip apex by observing a field emission patter of the tip apex.

16. The method of claim 13, further comprising, based on the detected light, increasing at least one parameter selected from the group consisting of a temperature of the tip and a gas pressure in a chamber housing the ion source.

17. A method, comprising:
    forming a tip of an ion source while emitting light from the ion source;
    passing ions generated by the ion source through an ion column;
    detecting at least a portion of the light that is emitted from the tip of the ion source while the tip of the ion source is being formed; and
    determining one or more parameters for preparing the tip of the ion source based on at least some of the detected light emitted from the tip of the ion source while the ion source was being formed, and/or determining a temperature of the tip based on at least some of the detected light emitted from the tip of the ion source while the ion source was being formed.

18. The method of claim 17, comprising determining the one or more parameters for preparing the tip of the ion source based on at least some of the detected light.

19. The method of claim 18, comprising determining a temperature of the tip based on at least some of the detected light.

20. The method of claim 17, comprising determining a temperature of the tip based on at least some of the detected light.

21. The method of claim 13, wherein the detected light is formed while forming the tip of the ion source.

* * * * *

UNITED STATES PATENT AND TRADEMARK OFFICE
CERTIFICATE OF CORRECTION

PATENT NO. : 9,029,765 B2
APPLICATION NO. : 13/892772
DATED : May 12, 2015
INVENTOR(S) : Richard Comunale et al.

It is certified that error appears in the above-identified patent and that said Letters Patent is hereby corrected as shown below:

References Cited

Page 2, Col. 2, line 9, under "OTHER PUBLICATIONS", delete "pararneters" and insert -- parameters --.

In the specification

Col. 1, line 62, before "light", insert -- reflect --.

Col. 4, line 1, delete "thrilled" and insert -- formed --.

Col. 4, line 6, delete "orientation" and insert -- orientation, --.

Col. 4, line 16, delete "investigate," and insert -- investigate --.

Col. 4, line 23, delete "clement," and insert -- element, --.

Col. 4, line 49, delete "appropriate," and insert -- appropriate --.

Col. 4, line 52, delete "steps" and insert -- steps, --.

Col. 5, line 16, delete "gas(es)," and insert -- gas(es); --.

Col. 6, line 9, delete "particle" and insert -- particles --.

Col. 6, line 16, delete "parades" and insert -- particles --.

Col. 6, line 18, delete "FIG. 1" and insert -- FIG. 1, --.

Signed and Sealed this
Twentieth Day of October, 2015

Michelle K. Lee
*Director of the United States Patent and Trademark Office*

CERTIFICATE OF CORRECTION (continued)
U.S. Pat. No. 9,029,765 B2

Col. 8, line 12, delete "anus" and insert -- arms --.

Col. 8, line 49, delete "out" and insert -- without --.

Col. 9, line 3, delete "hearings," and insert -- bearings, --.

Col. 9, line 41, make "To" and lines 42-48 a separate paragraph.

Col. 9, line 43, delete "using" and insert -- using a --.

Col. 9, line 64, delete "1515" and insert -- 1516 --.

Col. 10, line 36, delete "1000" and insert -- 1600 --.

In the claims

Col. 14, line 25, Claim 15, delete "patter" and insert -- pattern --.